US011147175B2

United States Patent
Castillo de la Cruz et al.

(10) Patent No.: US 11,147,175 B2
(45) Date of Patent: Oct. 12, 2021

(54) DATA STORAGE SYSTEM ENCLOSURE COVERS

(71) Applicant: Seagate Technology LLC, Cupertino, CA (US)

(72) Inventors: Angel Castillo de la Cruz, Pierce, CO (US); Joseph P. Manes, Arvada, CO (US); Kevin L. Van Pelt, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 113 days.

(21) Appl. No.: 16/560,605

(22) Filed: Sep. 4, 2019

(65) Prior Publication Data

US 2021/0068282 A1 Mar. 4, 2021

(51) Int. Cl.
| | | |
|---|---|---|
| *H05K 5/02* | (2006.01) | |
| *H05K 5/03* | (2006.01) | |
| *G06F 1/18* | (2006.01) | |
| *G11B 33/12* | (2006.01) | |
| *H05K 7/14* | (2006.01) | |
| *G11B 33/02* | (2006.01) | |

(52) U.S. Cl.
CPC .......... *H05K 5/0239* (2013.01); *G06F 1/181* (2013.01); *G06F 1/187* (2013.01); *G11B 33/124* (2013.01); *H05K 5/0226* (2013.01); *H05K 5/03* (2013.01); *H05K 7/1487* (2013.01); *G11B 33/027* (2013.01); *H05K 7/1411* (2013.01)

(58) Field of Classification Search
CPC ....... G06F 1/181; G06F 1/187; G11B 33/124; G11B 33/027; H05K 7/1487; H05K 5/0239; H05K 5/03
See application file for complete search history.

(56) References Cited

U.S. PATENT DOCUMENTS

| | | | | |
|---|---|---|---|---|
| 4,143,695 A * | 3/1979 | Hoehn | .................... | A45C 11/20 |
| | | | | 220/215 |
| 4,674,665 A * | 6/1987 | Kirk | .......................... | B60R 9/00 |
| | | | | 206/349 |
| 4,693,399 A * | 9/1987 | Hickman | ........... | B65D 47/0847 |
| | | | | 215/235 |
| 4,723,693 A * | 2/1988 | DeCoster | ........... | B65D 47/0876 |
| | | | | 222/483 |
| 6,308,870 B2 * | 10/2001 | Samz | ................. | B65D 21/0219 |
| | | | | 222/480 |
| 6,621,693 B1 * | 9/2003 | Potter | ..................... | G06F 1/184 |
| | | | | 257/E23.099 |
| 6,657,867 B2 | 12/2003 | Smith | | |

(Continued)

OTHER PUBLICATIONS

E-Switch Product Brochure, Series TS Switches—Snap Action Switches—Sub-Miniature; printed on Jul. 31, 2019 from https://www.e-switch.com/system/asset/product_line/data_sheet/126/TS.pdf; pp. 209-210.

(Continued)

*Primary Examiner* — Nidhi Thaker

(74) *Attorney, Agent, or Firm* — Faegre Drinker Biddle & Reath

(57) ABSTRACT

A system includes a chassis and a top cover assembly. The top cover assembly is coupled to the chassis. The top cover assembly includes a first lid, a second lid, a middle cover between the first lid and the second lid, and a hinge coupling together the first lid, the second lid, and the middle cover.

17 Claims, 16 Drawing Sheets

(56) References Cited

U.S. PATENT DOCUMENTS

| | | | | |
|---|---|---|---|---|
| 6,788,542 | B2* | 9/2004 | Rumney | H05K 7/1421 |
| | | | | 361/724 |
| 7,121,438 | B2* | 10/2006 | Hoepner | B65D 47/0895 |
| | | | | 222/544 |
| D543,030 | S* | 5/2007 | Schafer | D3/272 |
| 7,237,688 | B2 | 7/2007 | Pangerc et al. | |
| 7,913,868 | B2* | 3/2011 | Dolan | B65D 47/0847 |
| | | | | 220/254.2 |
| 8,363,414 | B2 | 1/2013 | Peng et al. | |
| 9,007,766 | B2* | 4/2015 | Harvilchuck | H05K 7/20727 |
| | | | | 361/696 |
| 9,763,350 | B2 | 9/2017 | Rust et al. | |
| 9,883,605 | B2 | 1/2018 | Donachy et al. | |
| 10,104,798 | B2 | 10/2018 | AbuGhazaleh et al. | |
| 10,126,788 | B2* | 11/2018 | Dai | H05K 7/1487 |
| 10,321,701 | B2* | 6/2019 | Lazzarini | A23G 9/227 |
| 10,371,429 | B1* | 8/2019 | Winters Giesting | F25D 3/08 |
| 10,589,909 | B2* | 3/2020 | Daggett | B65D 51/18 |
| 10,631,430 | B2* | 4/2020 | Zhai | H05K 7/1487 |
| 10,798,837 | B1* | 10/2020 | Sauer | H05K 7/1488 |
| 10,866,290 | B2* | 12/2020 | Ding | G01R 33/072 |
| 2005/0185370 | A1 | 8/2005 | Chung | |
| 2006/0124643 | A1* | 6/2006 | Markert | B65D 43/161 |
| | | | | 220/254.3 |
| 2007/0069584 | A1* | 3/2007 | Dorr | G06F 1/187 |
| | | | | 307/32 |
| 2007/0128506 | A1 | 6/2007 | Hsu et al. | |
| 2007/0131701 | A1* | 6/2007 | Herbert | B65D 21/0233 |
| | | | | 220/826 |
| 2008/0253077 | A1 | 10/2008 | Miyamoto et al. | |
| 2010/0007252 | A1* | 1/2010 | Liu | H05K 7/1487 |
| | | | | 312/223.2 |
| 2013/0099645 | A1* | 4/2013 | Hsieh | H05K 7/1487 |
| | | | | 312/326 |
| 2015/0061482 | A1* | 3/2015 | Yu | H05K 7/1487 |
| | | | | 312/326 |
| 2016/0295728 | A1* | 10/2016 | Alvarado | H05K 5/03 |
| 2018/0177068 | A1* | 6/2018 | Zhai | H05K 7/1487 |
| 2020/0340272 | A1* | 10/2020 | Westphall | H05K 7/1487 |

OTHER PUBLICATIONS

Tatay Products online ad, Underbed Storage Box w/Wheels Blue; printed on Jul. 31, 2019 from https://www.tatay.com/products/household/storage/storage-boxes/underbed-storage-box-w-wheels-blue/11 . . . ; 8 pages.

The Container Store online ad, Our Long Under Bed Box with Wheels—Under Bed Storage with Wheels | The Container Store; printed on Jul. 31, 2019 from https://www.containerstore.com/s/closet/under-the-bed-storage/our-long-under-bed-box-with-wheels/12d?p . . . , 3 pages.

Walmart.com Ad, Sterilite 66 Wuart Stadium Blue Ultra Storage Box, 2 Piece—Walmart.com; printed on Jul. 31, 2019 from https://www.walmart.com/ip/Sterilite-66-Quart-Stadium-Blue-Ultra-Sotrage-Box-2-Piece/45924275?wmls . . . , 14 pages.

\* cited by examiner

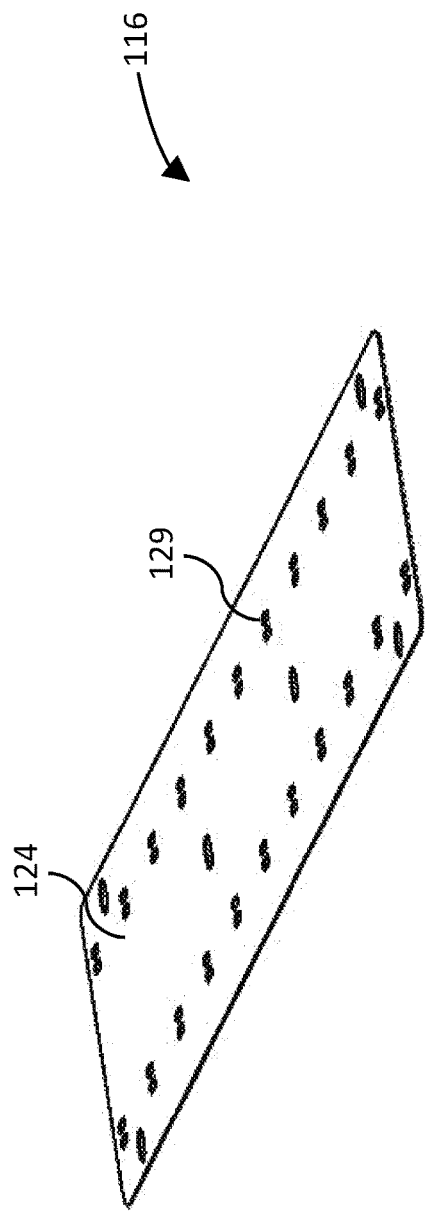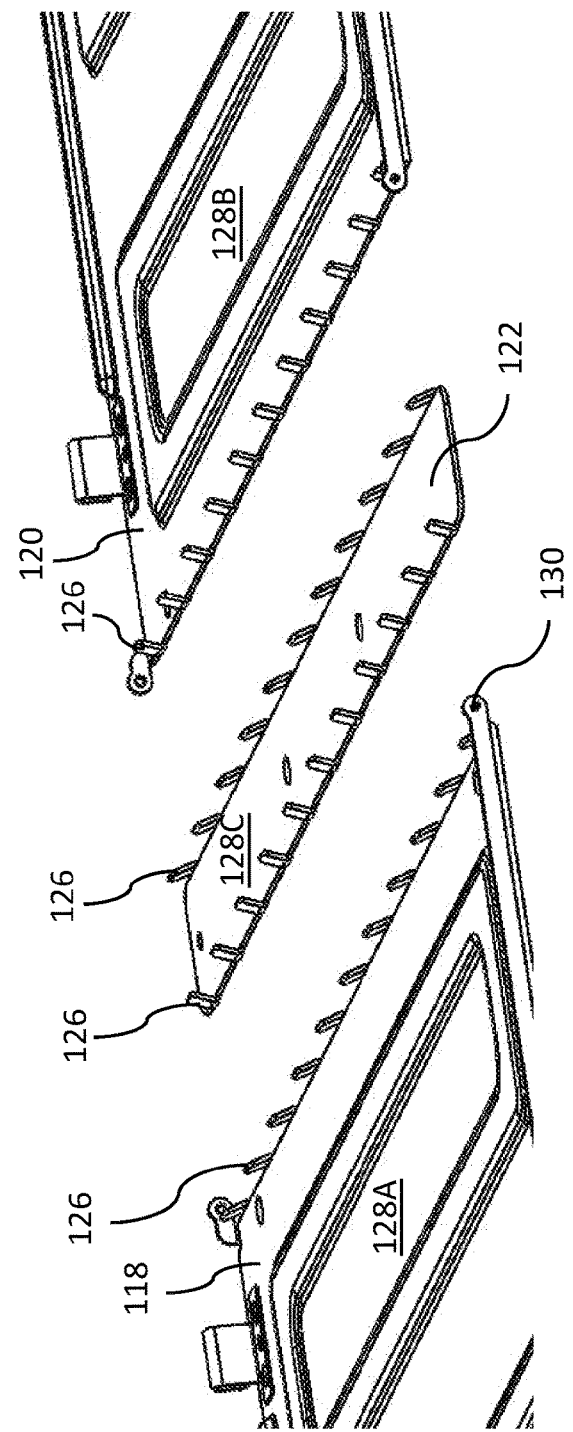
FIG. 3

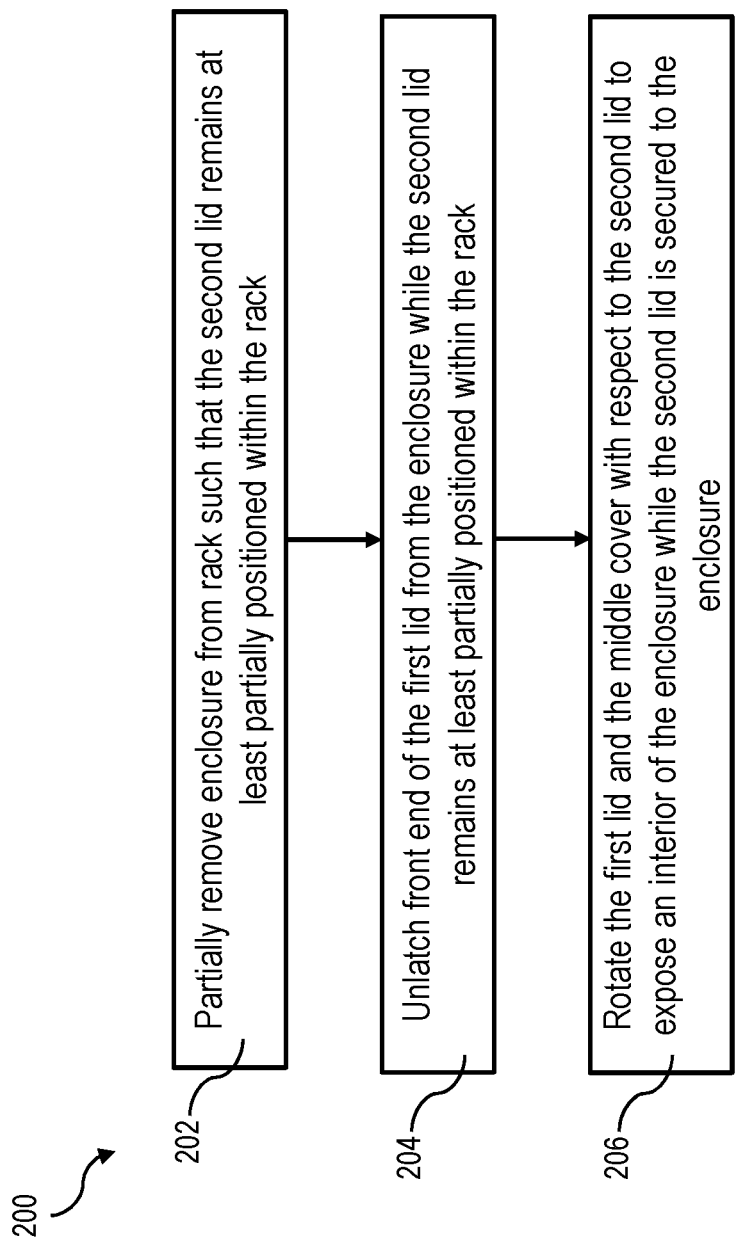

DATA STORAGE SYSTEM ENCLOSURE COVERS

In certain embodiments, a system includes a chassis and a top cover assembly coupled to the chassis. The top cover assembly includes a first lid, a second lid, a middle cover therebetween, and a hinge coupling together the first lid, the second lid, and the middle cover.

In certain embodiments, an assembly includes a first lid with a first pin, a second lid with a second pin, a middle cover therebetween the first lid and the second lid, and a hinge coupling together the first lid, the second lid, and the middle cover.

In certain embodiments, a method is disclosed for use with a top cover assembly coupled to an enclosure positioned in a rack. The top cover assembly includes a first lid, a second lid, a middle cover positioned therebetween, and a hinge coupling together the first lid, the second lid, and the middle cover. The method includes partially removing the enclosure from the rack such that the second lid remains at least partially positioned within the rack, unlatching a front end of the first lid from the enclosure while the second lid remains at least partially positioned within the rack, and rotating the first lid and the middle cover with respect to the second lid to expose an interior of the enclosure while the second lid is secured to the enclosure.

In certain embodiments, an apparatus includes an enclosure with a chassis and a top cover assembly coupled to the chassis. The chassis includes slots defined in sidewalls of the chassis. The top cover assembly includes a first lid and a second lid coupled to each other via a hinge. The hinge includes a rod that extends at least partially within the slots such that the top cover assembly can slide between a front position and a back position.

In certain embodiments, a method is disclosed for use with a top cover assembly coupled to an enclosure positioned in a rack. The top cover assembly includes a first lid and a second lid coupled together by a hinge. The method includes partially removing the enclosure from the rack such that the second lid remains at least partially positioned within the rack, unlatching a front end of the first lid from the enclosure while the second lid remains at least partially positioned within the rack, sliding the top cover assembly within slots in the enclosure, and rotating the first lid about the hinge with respect to the second lid to expose an interior of the enclosure while the second lid is secured to the enclosure.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIGS. 3, 4A, and 4B show bottom views of portions of a top cover assembly of the enclosure of FIG. 2, in accordance with certain embodiments of the present disclosure.

FIG. 9 shows a block diagram of steps of a method, in accordance with certain embodiments of the present disclosure.

Figure 1:
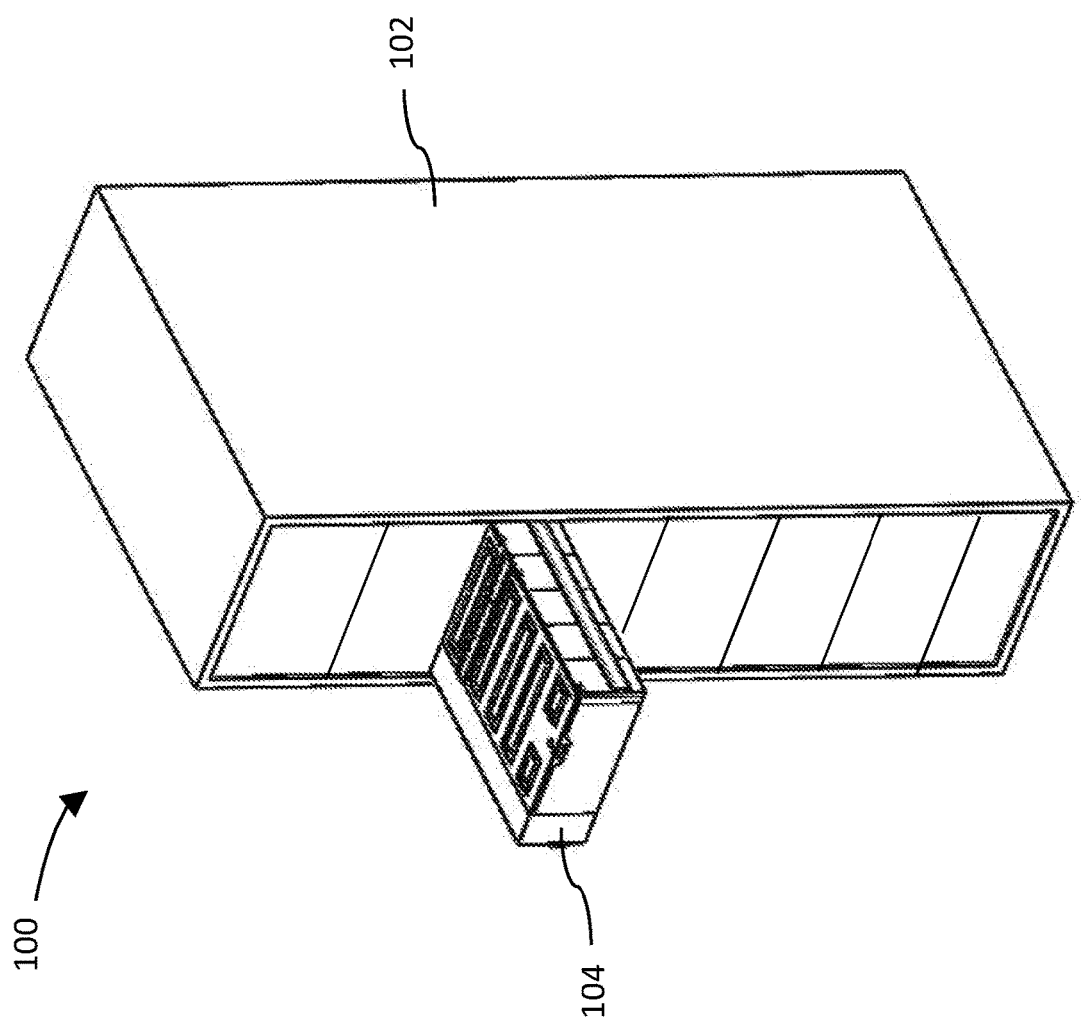
FIG. 1 shows a perspective view of a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems are used to store and process vast amounts of data by integrating and managing many individual data storage devices within the data storage systems. With existing data storage system designs, accessing the individual data storage devices can be a challenging task. For example, entire individual enclosures within the data storage system must be removed or slid out of the data storage system and the entire cover of such enclosures must be removed before data storage devices can be accessed. These covers can be large, heavy, and—particularly for enclosures positioned high above the ground—challenging to access. Certain embodiments of the present disclosure feature top cover assemblies and corresponding enclosures for data storage systems that can provide access to the interior of the enclosures without needing to remove the entire top cover assembly.

FIG. 1 shows a data storage system 100 including a rack 102 (e.g., a cabinet) with a plurality of enclosures 104. Each enclosure 104 can house data storage devices (e.g., hard disk drives and/or solid state drives) and/or data processing devices (e.g., data processing units such as graphics processing units) and can be arranged in a drawer-like fashion to slide into and out of the rack 102.

Figure 2:
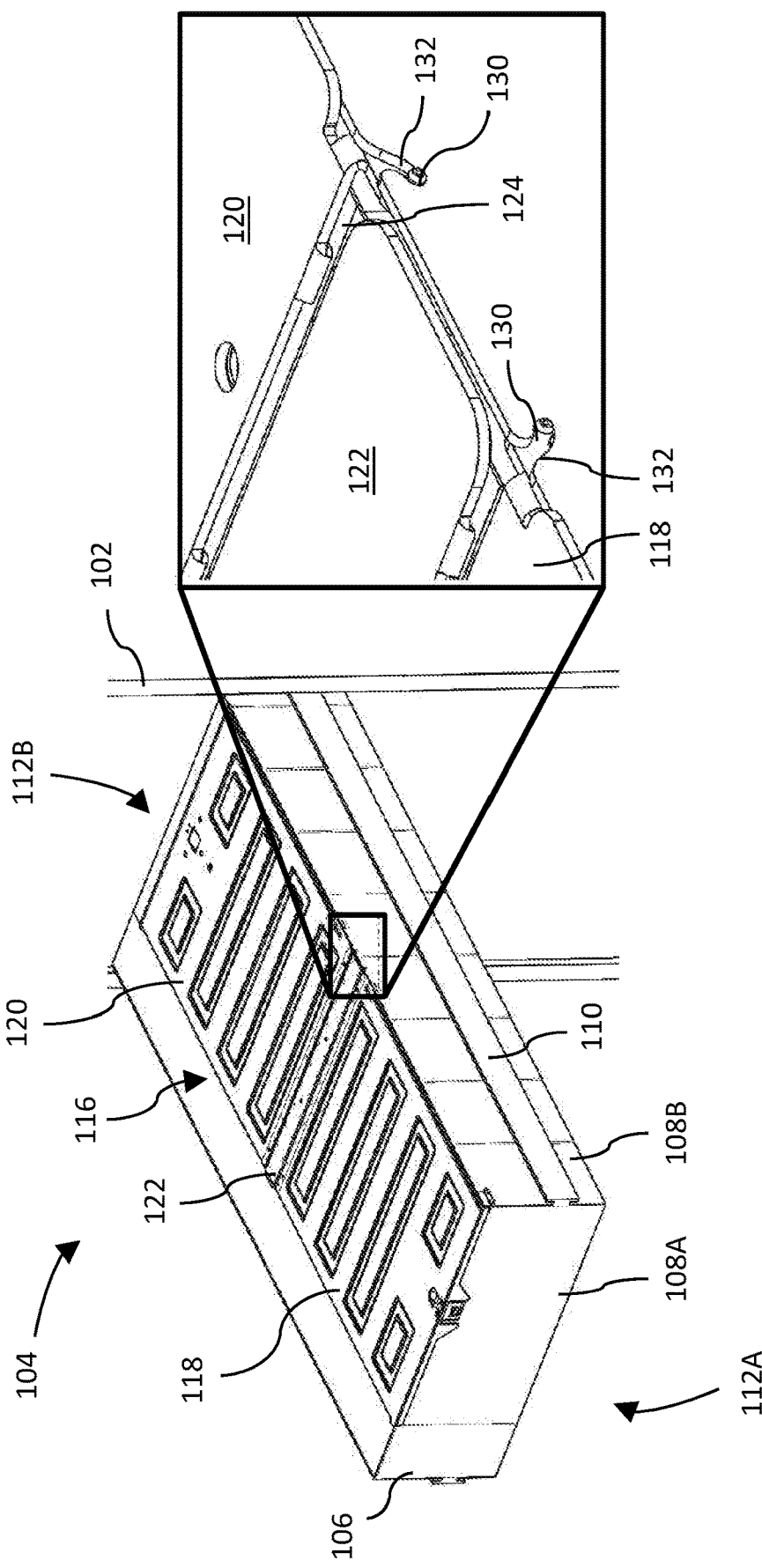
FIG. 2 shows a perspective view of an enclosure of the data storage system of FIG. 1, in accordance with certain embodiments of the present disclosure.

FIG. 2 shows one of the enclosures 104 slid out of the rack 102 while still being coupled to the rack 102. The enclosure 104 includes a chassis 106 with a front side wall 108A, first side wall 108B, a second side wall (not shown), and a bottom wall (not shown). The enclosure 104 can include slides 110 coupled to the chassis 106 that enable the enclosure 104 to move into and out of the rack 102.

The enclosure 104 extends between a front end 112A and a back end 112B with the back end 112B positioned within the rack 102. When assembled, the enclosure 104 houses and supports the data storage devices 114 (shown in FIGS. 5-7), data processing units, electrical components (e.g., wiring, circuit boards), and cooling devices (e.g., air movers, heat exchangers) among other things.

Figure 8:
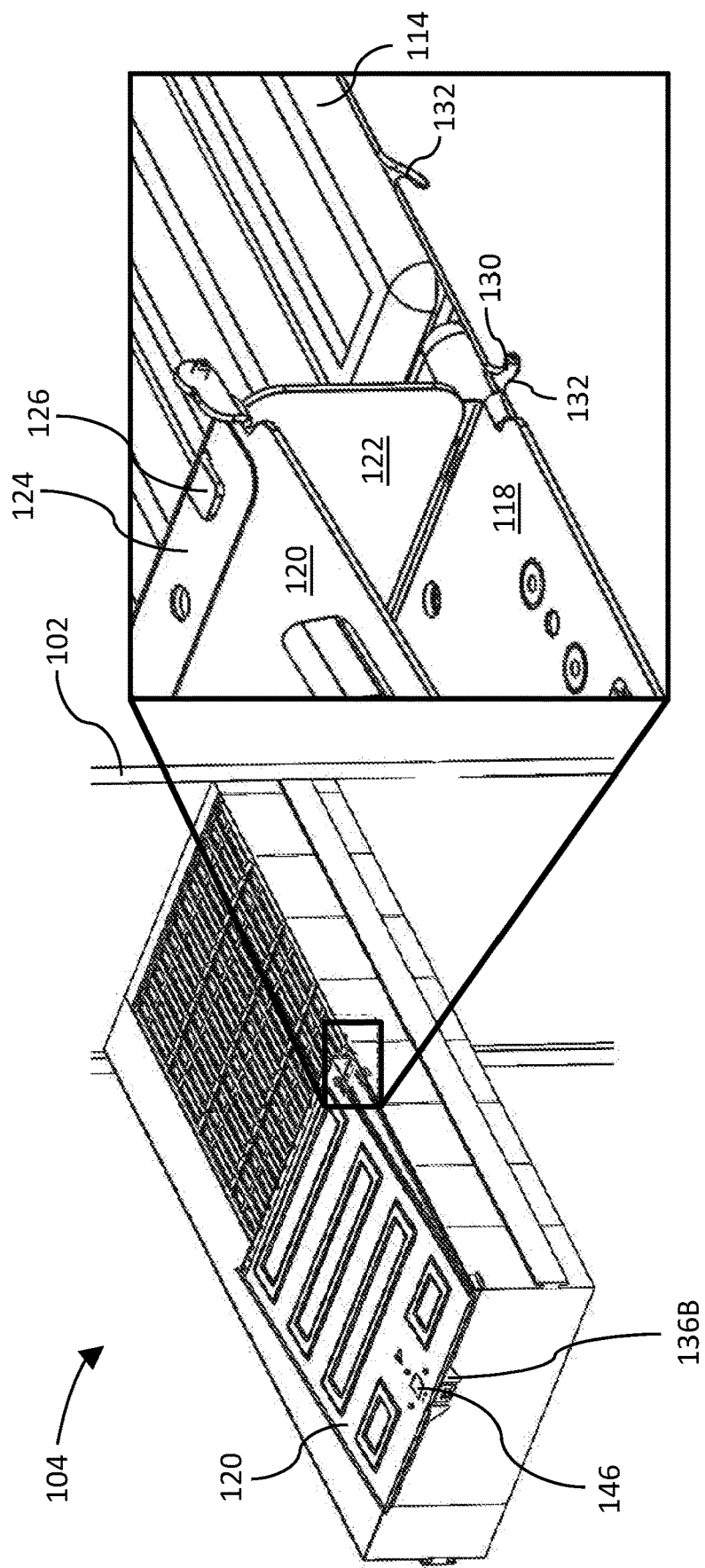
FIG. 8 shows a perspective view of the enclosure of FIG. 2, in accordance with certain embodiments of the present disclosure.

Further, when assembled, the enclosure 104 includes a top cover assembly 116 that is coupled to the chassis 106. The top cover assembly 116 includes a front lid 118, a back lid 120, a middle cover 122 positioned between the front lid 118 and the back lid 120, and a hinge 124 (best seen in FIGS. 3, 4A, and 4B). In certain embodiments, the components of the chassis 106, the front lid 118, the back lid 120, and the middle cover 122 of the top cover assembly 116 comprise materials such a metal (e.g., steel, aluminum). In certain embodiments, the hinge 124 comprises a flexible material that allows the front lid 118 and the back lid 120 to rotate with respect to the middle cover 122. In certain embodiments, the hinge 124 allows for the front lid 118 and the back lid 120 to fold over on each other, which is shown in FIG. 8. Further, when the lids of the top cover assembly 116 are closed, the hinge 124 can help prevent air leaking from the enclosure 104 by at least partially providing a seal between the lids and the chassis 106. Air leakage can negatively affect the ability of the enclosure 102 to maintain desired operating temperatures. In certain embodiments, the hinge 124 comprises a non-metallic material such as rubber, plastic, tapes, and the like. In certain embodiments, the hinge 124 is a sheet comprising polypropylene.

Figure 4A:
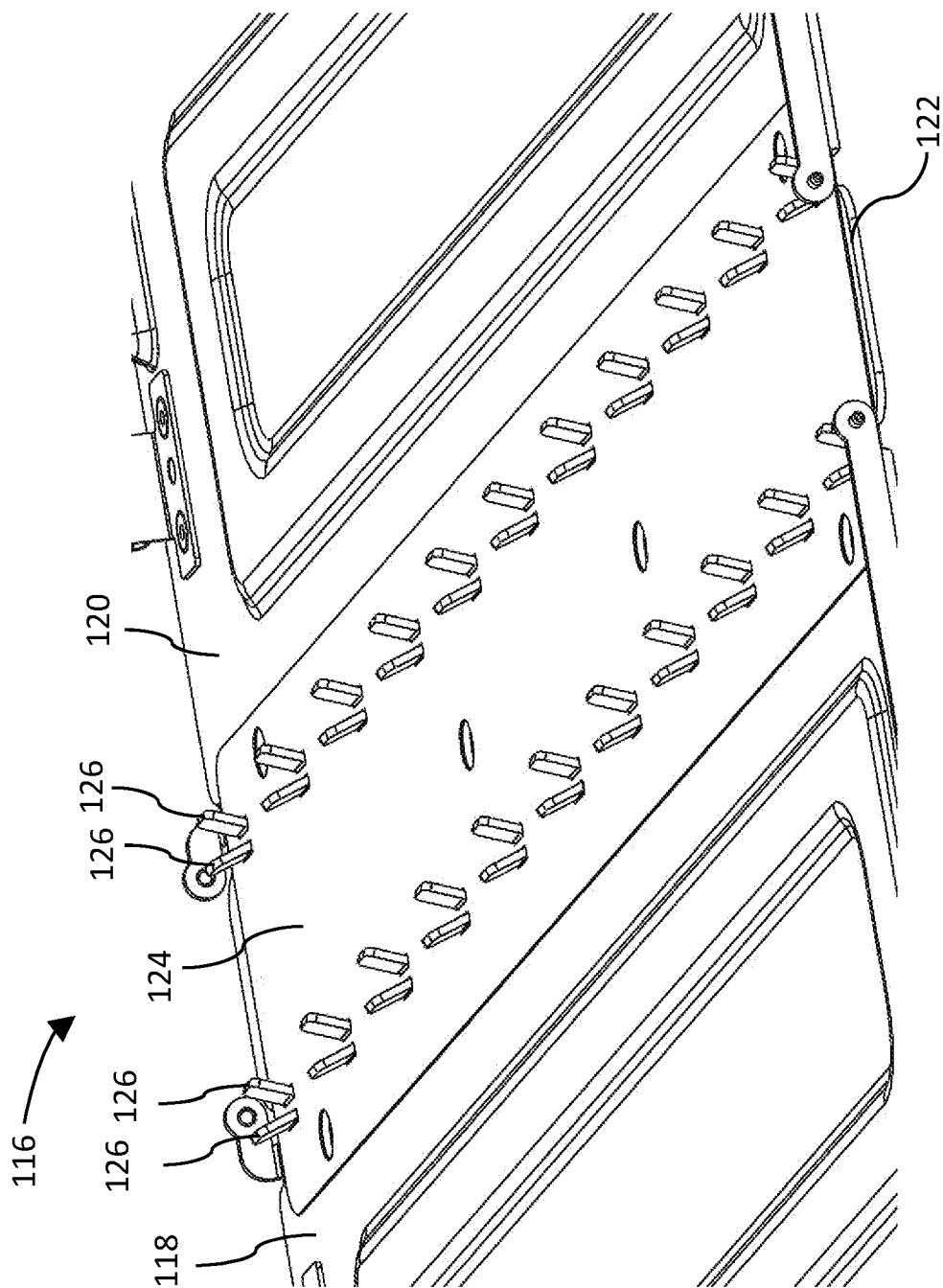
Figure 4B:
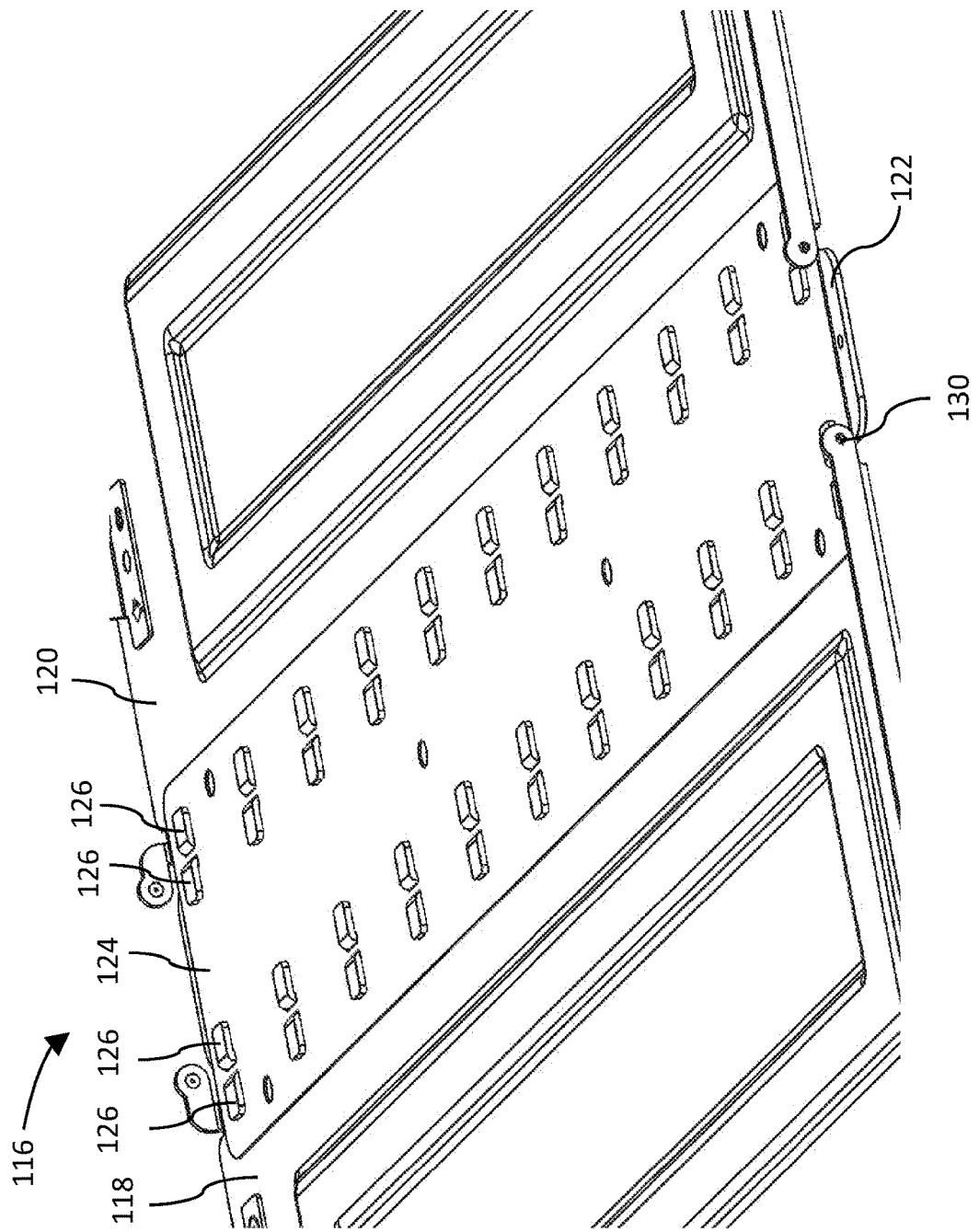

FIGS. 3, 4A, and 4B show portions of an interior-facing side of the top cover assembly 116. FIG. 3 shows the top cover assembly 116 without the hinge 124 installed and before the top cover assembly 116 is fully assembled. FIG. 3A shows the hinge 124 coupled to the front lid 118, the back lid 120, and the middle cover 122. And, FIG. 4 shows the top cover assembly 116 with the hinge 124 installed and secured to the front lid 118, the back lid 120, and the middle cover 122. In certain embodiments, like that shown in FIGS. 3, 4A, and 4B, the front lid 118 includes a row of fingers 126 that extend from a bottom surface 128A of the front lid 118, the back lid 120 includes a row of fingers 126 that extend from a bottom surface 128B of the back lid 120, and the middle cover 122 includes two row of fingers 126 that extend from a bottom surface 128C of the middle cover 122. The fingers 126 may be at least partially pre-bent in a desired direction.

To couple the hinge 124 to the front lid 118, the back lid 120, and the middle cover 122; the fingers 126 extend through holes 129 in the hinge 124 (as shown in FIG. 4A) and then are bent so that the fingers 126 clamp the hinge 124 between the fingers 126 and the respective bottom surfaces 128A-C of the front lid 118, the back lid 120, and the middle cover 122 (as shown in FIG. 4B). For example, as shown in FIG. 4A, the hinge 124 may be positioned so that the fingers 126 extend through holes 129 in the hinge 124. Then, when portions of the front lid 118, the back lid 120, and the middle cover 122 are positioned between two fixtures, the fixtures can be pressed together such that the fingers 126 are bent to clamp the hinge 124 between the fingers 126 and the respective front lid 118, back lid 120, and middle cover 122.

As shown in FIG. 4B, the fingers 126 of the front lid 118 and one of the rows of fingers 126 of the middle cover 122 are bent in the opposite direction, and the fingers 126 of the back lid 120 and one of the rows of fingers 126 of the middle cover 122 are bent in the opposite direction. Additionally or alternatively, the hinge 124 can be coupled to the front lid 118, the back lid 120, and the middle cover 122 by other fastening means such as rivets, clamps, and the like.

Moving back to FIG. 2, the inset in FIG. 2 shows that the front lid 118 and the back lid 120 each include pins 130. The pins 130 are shown as extending through respective cam slots 132 formed in the first sidewall 108B of the chassis 106. Although only the first sidewall 108B and one side of the front lid 118 and the back lid 120 is shown in FIG. 2, identical features (e.g., pins and cam slots) can be included on the opposite side of the chassis 106 and the front lid 118 and the back lid 120. As will be discussed in more detail below, the cam slots 132 are slots that guide or otherwise allow the pins 130 to slide within the cam slots 132 as the respective front lid 118 and the back lid 120 are opened. As shown in FIG. 2, the cam slots 132 can be arc-shaped slots. When both the front lid 118 and the back lid 120 are closed (as shown in FIG. 2), the pins 130 rest at or near a bottom portion of the cam slots 132.

Figure 5:
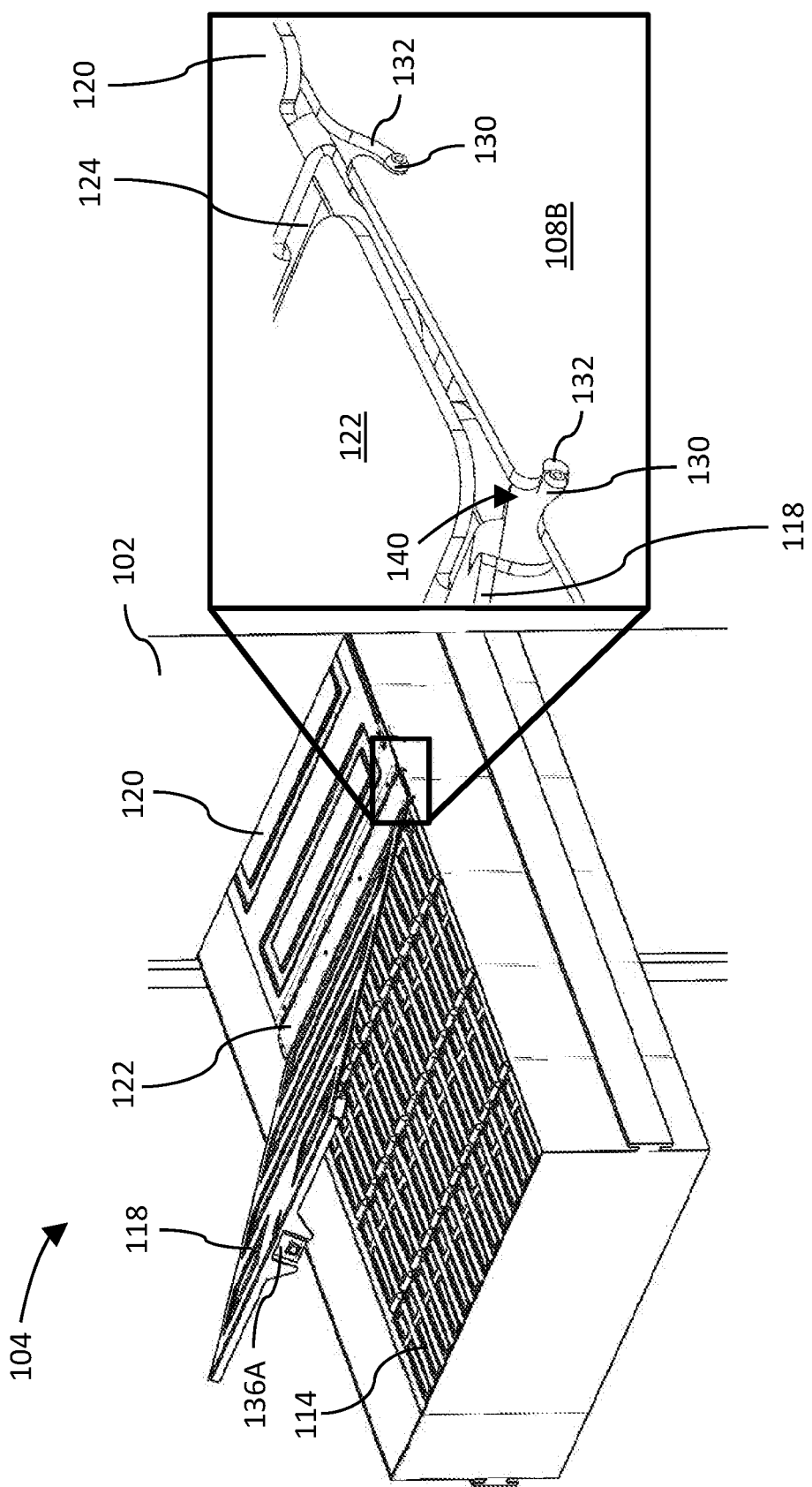
FIGS. 5 and 6 show perspective views of the enclosure of FIG. 2, in accordance with certain embodiments of the present disclosure.

FIG. 5 shows the front lid 118 partially opened such that the data storage devices 114 positioned within the enclosure 104 at or near the front end 112A of the enclosure 104 are exposed. The front lid 118 is shown partially opened while the back lid 120 is closed and at least partially positioned within the rack 102.

To open the front lid 118, a latch 136A positioned at a front end of the front lid 118 is first released to allow the front lid 118 to decouple from the front end 112A of the enclosure 104. As the front lid 118 is initially lifted, the front lid 118 rotates about a first hinge axis 138A (shown in FIG. 6) between the front lid 118 and the middle cover 122. As the front lid 118 rotates, the pin 130 of the front lid 118 slides within the cam slot 132 towards an opening 140 of the cam slot 132.

Figure 6:
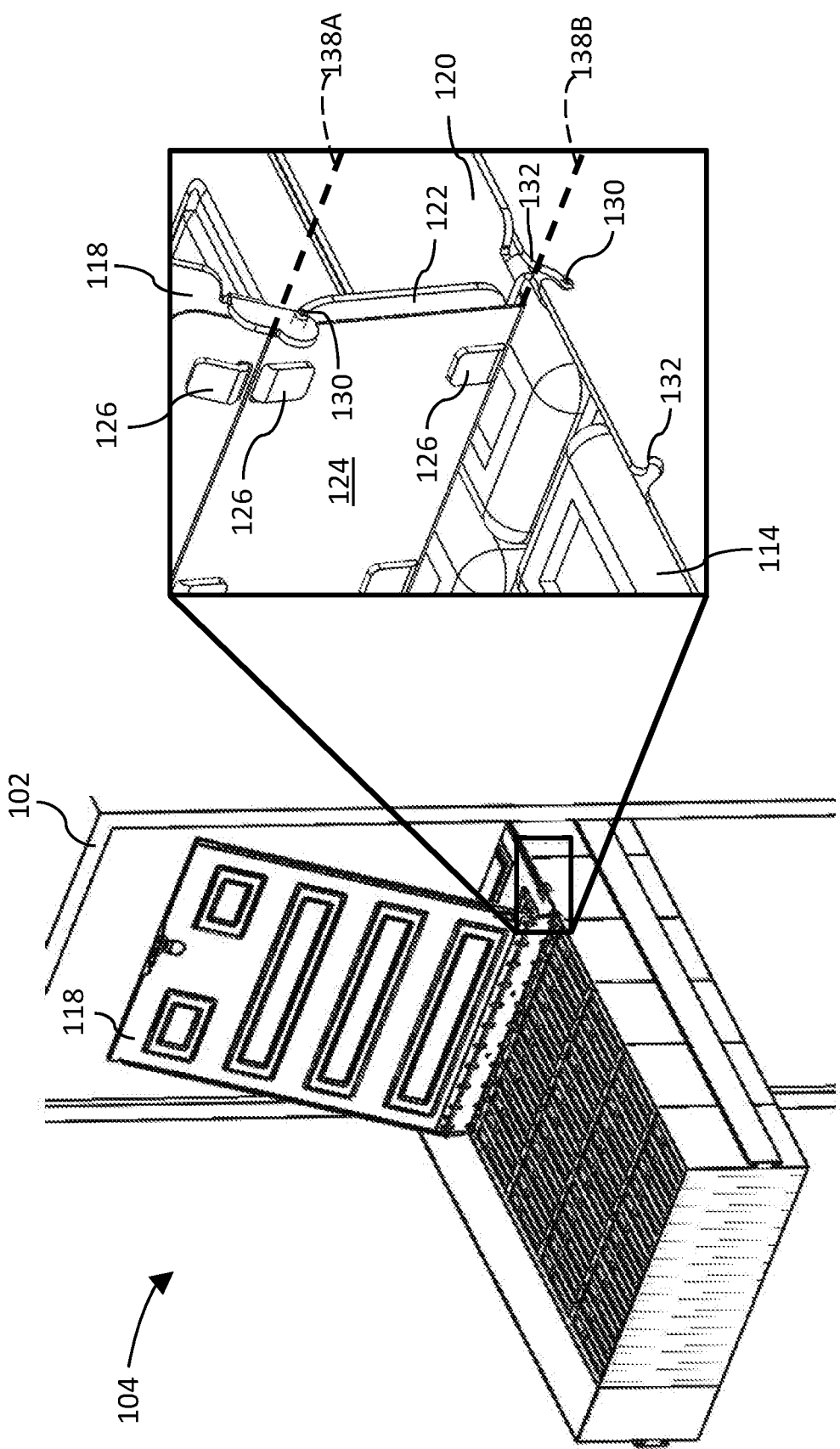

FIG. 6 shows the front lid 118 of the top cover assembly 116 opened such that data storage devices 114 can be accessed (e.g., installed or removed from the enclosure 104). As such, the data storage devices 114 at or near the front end 112A of the enclosure 104 can be accessed without needing to lift or remove the entire top cover assembly 116. Further, as shown in FIG. 6, the enclosure 104 does not need to be completely pulled out from the rack 102 to access the data storage devices 114.

The inset in FIG. 6 shows the front lid 118 rotated at a non-zero angle about the first hinge axis 138A with respect to the middle cover 122. Further, the pin 130 of the front lid 118 has been removed from the cam slot 132, and the middle cover 122 has rotated with respect to the back lid 120 about a second hinge axis 138B. The pin 130 of the back lid 120 remains positioned within its cam slot 132. Further, the back lid 120 may include a latch 136B (shown in FIG. 7) that keeps the back lid 120 from decoupling from the back end 112B of the enclosure 104 and rotating.

Figure 7C:
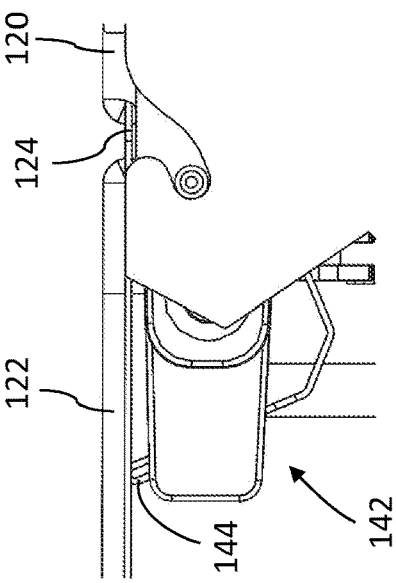
FIGS. 7A-7C show various views of a sensor assembly positioned within the enclosure of FIG. 2, in accordance with certain embodiments of the present disclosure.
Figure 7B:
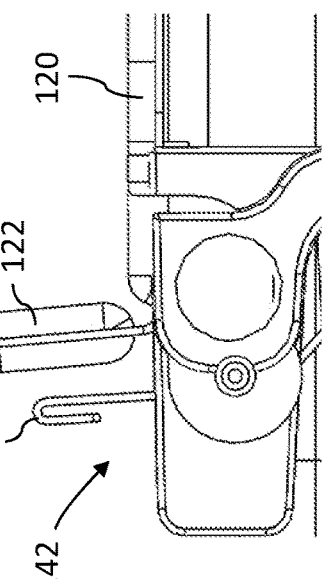
Figure 7A:
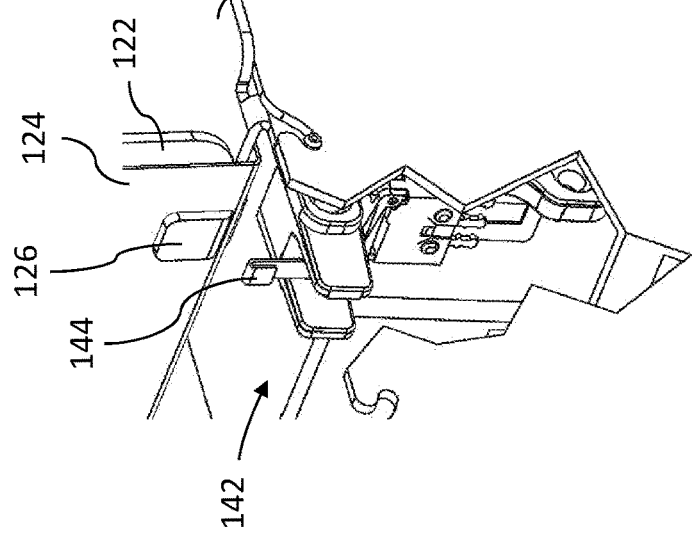

FIGS. 7A, 7B, and 7C show different views of a sensor assembly 142 positioned within the enclosure 104 and arranged to detect when either the front lid 118 or the back lid 120 are open. FIGS. 7A and 7B show views of the sensor assembly 142 when the front lid 118 is open, and FIG. 7C shows a view of the sensor assembly 142 when the front lid 118 is closed. In certain embodiments, the sensor assembly 142 is positioned underneath the middle cover 122 when the middle cover 122 is in the closed position (e.g., when both the front lid 118 and the back lid 120 are closed). In certain embodiments, the sensor assembly 142 is coupled to one of the sidewalls of the chassis 106 or to the middle cover 122 itself. When either the front lid 118 or the back lid 120 is open, the middle cover 122 rotates such that one end of the middle cover 122 moves away from the enclosure 104 (and therefore the sensor assembly 142). As such, opening of either lid can be detected with a single sensor assembly 142.

In embodiments where the sensor assembly 142 includes a switch 144, the switch 144 can physically contact the middle cover 122 when the middle cover 122 is in the closed position as shown in FIG. 7C. As the front lid 118 or the back lid 120 is opened (as shown in FIGS. 7A and 7B), the switch 144 is actuated (e.g., extends) as the middle cover 122 moves away from the sensor assembly 142. Similarly, in embodiments where the sensor assembly 142 is a proximity sensor (e.g., Hall sensor, magnetic switch), the sensor assembly 142 can be positioned so that the sensor assembly 142 detects when the middle cover 122 is open although the sensor assembly 142 may not physically contact the middle cover 122.

Once the front lid 118 or the back lid 120 is at least partially open, the sensor assembly 142 detects that one of the lids is open and can generate a sensor signal indicating that one of the lids is open. In certain embodiments, the sensor signal is sent to electronics (e.g., a controller) in the enclosure 104 or rack 102. When the electronics receive a sensor signal indicating that one of the lids is open, the electronics can initiate a routine that, for example, increases the rotational speed of fan assemblies in the affected enclosure 104 or otherwise adjusts how one or more of the components of the enclosure 104 function. Increasing the rotational speed of the fan assemblies can provide additional cooling while one of the lids of the top cover assembly 116 is open.

FIG. 8 shows the back lid 120 of the top cover assembly 116 opened such that data storage devices 114 can be accessed. As such, the data storage devices 114 at or near the back end 112B of the enclosure 104 can be accessed without needing to lift or remove the entire top cover assembly 116.

As shown in FIG. 8, the back lid 120 can be folded over such that it at least partially rests on the front lid 118. The inset in FIG. 8 shows the back lid 120 rotated at a non-zero angle about the second hinge axis 138B with respect to the middle cover 122. Further, the pin 130 of the back lid 120 has been removed from the cam slot 132, and the middle cover 122 has rotated with respect to the front lid 118 about the first hinge axis 138A. The pin 130 of the front lid 118 remains positioned within its cam slot 132. Further, the front lid 118 (via the latch 136A) remains coupled to the front end 112A of the enclosure 104. In certain embodiments, like the back lid 120 shown in FIG. 8, the lids of the top cover assemblies described herein can include one or more apertures 146 that are shaped to allow a user to use their finger or a tool to help pull open the lids or to provide access to a portion of the latches so that a user can unlatch the lids from the enclosure 104.

Although in FIGS. 6 and 8, the front lid 118 and the back lid 120 are shown as each providing access and covering equal numbers of rows of data storage devices 114, one of the lids (118, 120) may be larger than the other to provide access to more data storage devices 114. Further, although the top cover assembly 116 is shown as having only two lids, the top cover assembly 116 can include additional lids, middle covers, and hinges.

FIG. 9 outlines a method 200 for use with the enclosure 104. For example, the method 200 can includes steps for accessing the data storage devices 114 positioned within the enclosure 104 near the front end 112A. In certain embodiments, the method 200 includes partially removing the enclosure 104 from the rack 102 such that the back lid 120 remains at least partially positioned within the rack 102 (block 202 in FIG. 9). The method 200 further includes unlatching a front end of the front lid 118 from the enclosure 104 while the second lid 120 remains at least partially positioned within the rack 102 (block 204 in FIG. 9). The method 200 further includes rotating the front lid 118 and the middle cover 122 with respect to the back lid 120 to expose an interior of the enclosure 104 while the back lid 120 is secured to the enclosure 104 (block 206 in FIG. 9).

The method 200 can include steps for accessing the data storage devices 114 positioned within the enclosure 104 near the back end 112B. In certain embodiments, the method 200 includes removing the enclosure 104 from the rack 102 such that the back lid 120 is removed from the rack 102, unlatching a back end of the second lid 120 from the enclosure 104, and rotating the second lid 120 and the middle cover 122 with respect to the front lid 118 to expose the interior of the enclosure 104.

Figure 10A:
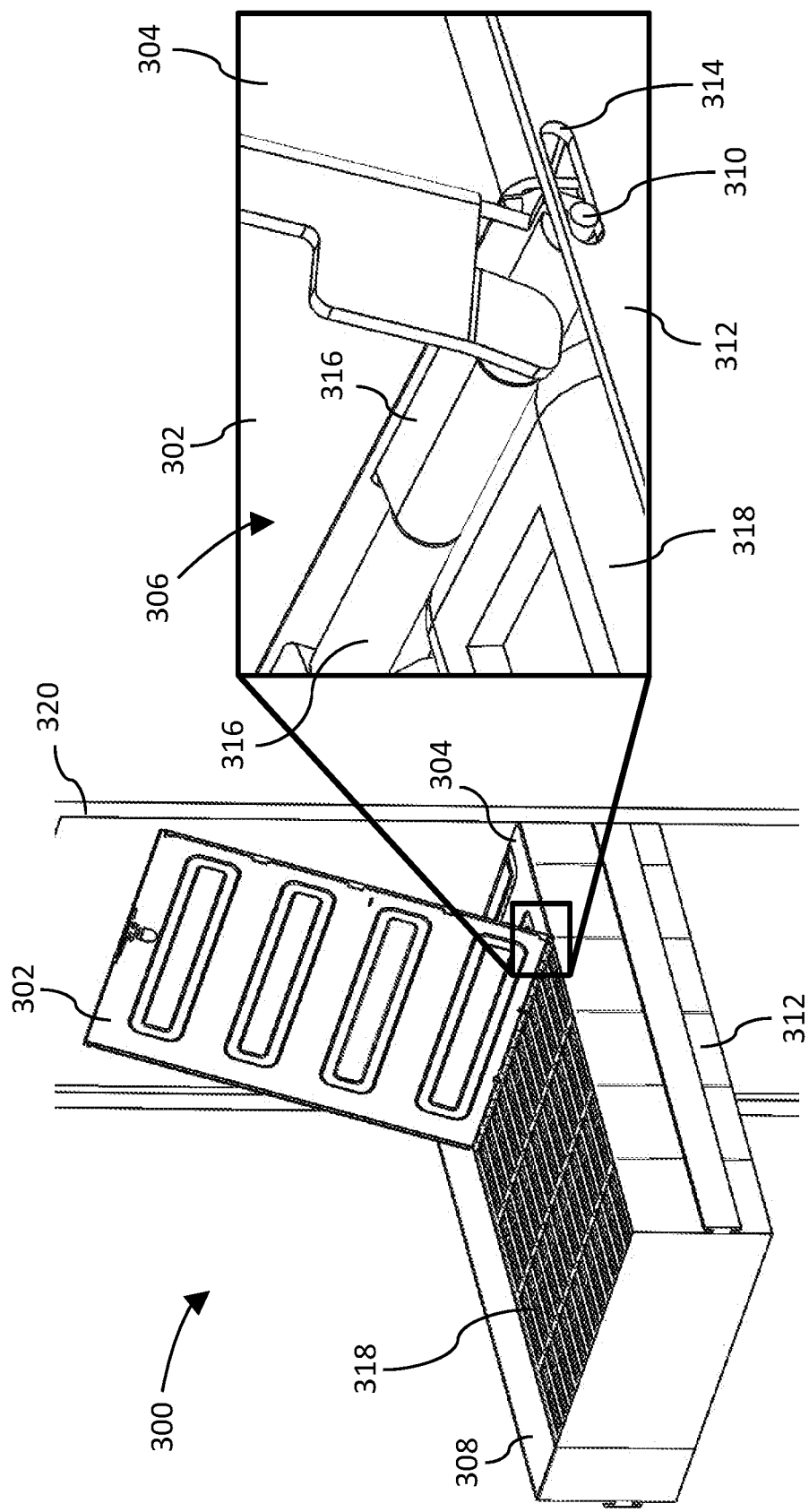
FIGS. 10A, 10B, 11A, and 11B show various views of portions of a top cover assembly, in accordance with certain embodiments of the present disclosure.

FIG. 10A shows a top cover assembly 300 that can be used with the data storage system 100, rack 102, and enclosure 104 described above. The top cover assembly 300 includes a front lid 302 and a back lid 304 that are coupled together at a hinge portion 306 near a middle portion of an enclosure 308. The hinge portion 306 includes a rod 310 that extends between sidewalls 312 of the enclosure 308. As shown in the inset in FIGS. 10A and 10B, the rod 310 extends into slots 314 in the sidewalls 312 of the chassis. The top cover assembly 300 can include pins (similar to the pins 130 described above) on each of the front lid 302 and the back lid 304 for removably coupling to respective cam slots in the sidewalls 312 of the chassis.

Figure 11B:
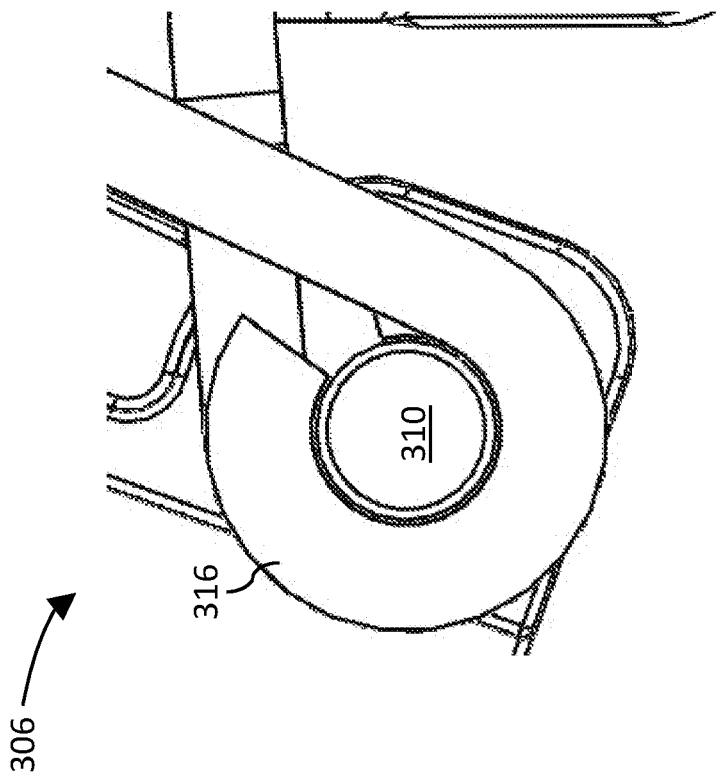
Figure 11A:
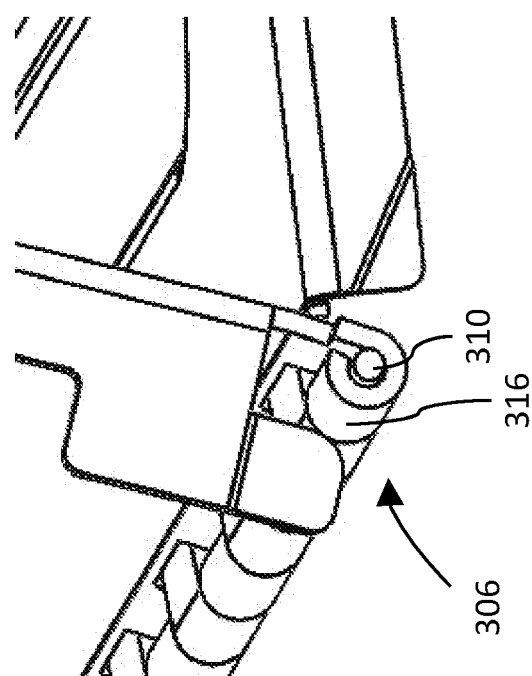

The front lid 302 and the back lid 304 each include a row of hinge components 316, which are secured to the rod 310 but can rotate around the rod 310. FIGS. 11A and 11B show one example of a hinge component 316 that extends at least partially around the rod 310. Other types of hinge arrangements can be used for this dual-lid top cover assembly 300.

Figure 10B:
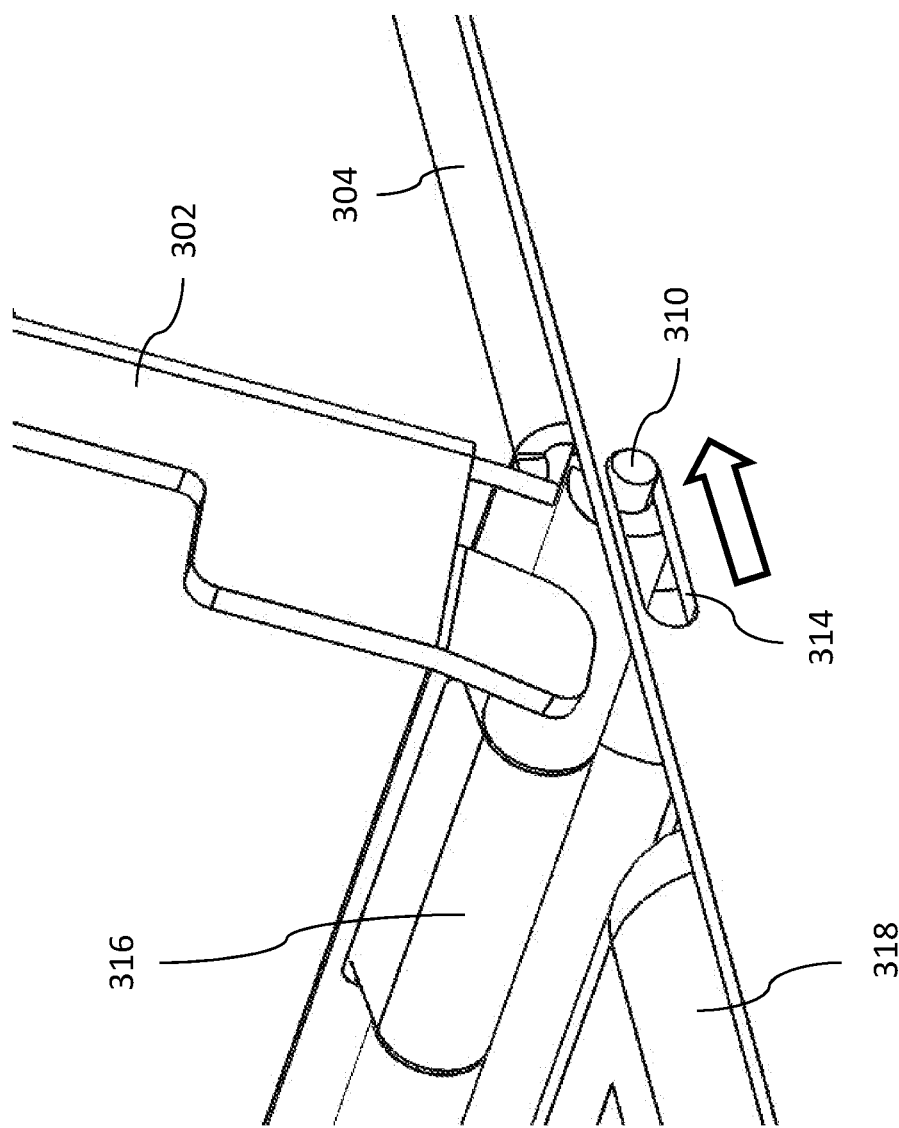

As shown in FIG. 10A, the front lid 302 can be opened (via rotating at the hinge portion 306) to provide access to data storage devices 318 positioned within the enclosure 308 while the enclosure 308 is only partially removed from a rack 320. In certain embodiments, after unlatching the front lid 302, the front lid 302 can be shifted further back (as shown in FIG. 10B) by sliding the rod 310 within the slots 314 in the sidewalls 312. Sliding the front lid 302 back allows access to the middle row of data storage devices 318 positioned within the enclosure 308 because, in certain embodiments with limited spacing between data storage device 318, the front lid 302 may interfere with access to the data storage devices 318.

When the enclosure 308 is removed such that the back lid 304 is out of the rack 320, the back lid 304 can be opened to provide access to the data storage devices 318. As with the front lid 302, after unlatching the back lid 304, the back lid 304 can be shifted towards a front end of the enclosure 308 by sliding the rod 310 within the slots 314 in the sidewalls 312 to provide clearance for the data storage devices 318 positioned in the middle row of the enclosure 308. As such, the top cover assembly 300 can provide access to the interior of the enclosure 308 (and therefore the data storage devices 318) without needing to remove the entire top cover assembly 300. The front lid 302 and the back lid 304 can be sized to provide access to the same or different number of data storage devices 318.

Figure 12A:
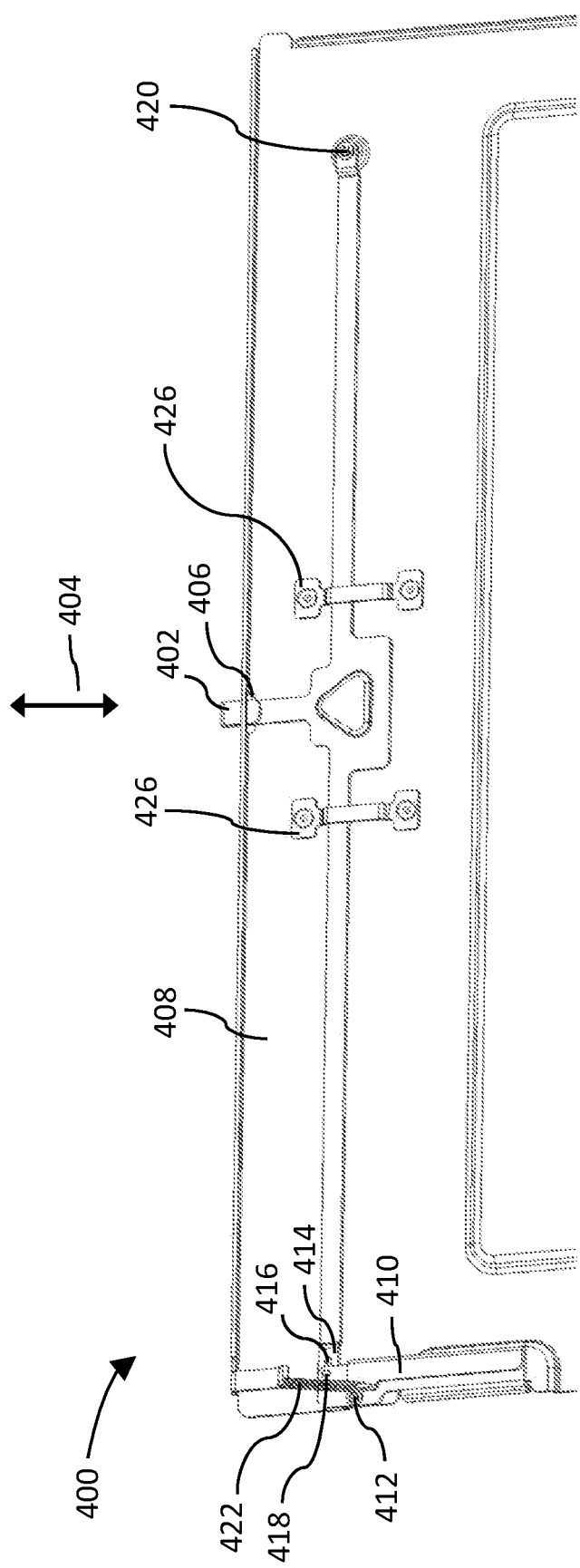
FIGS. 12A, 12B, 13A, and 13B show various views of a latch assembly for use with top cover assemblies, in accordance with certain embodiments of the present disclosure.
Figure 12B:
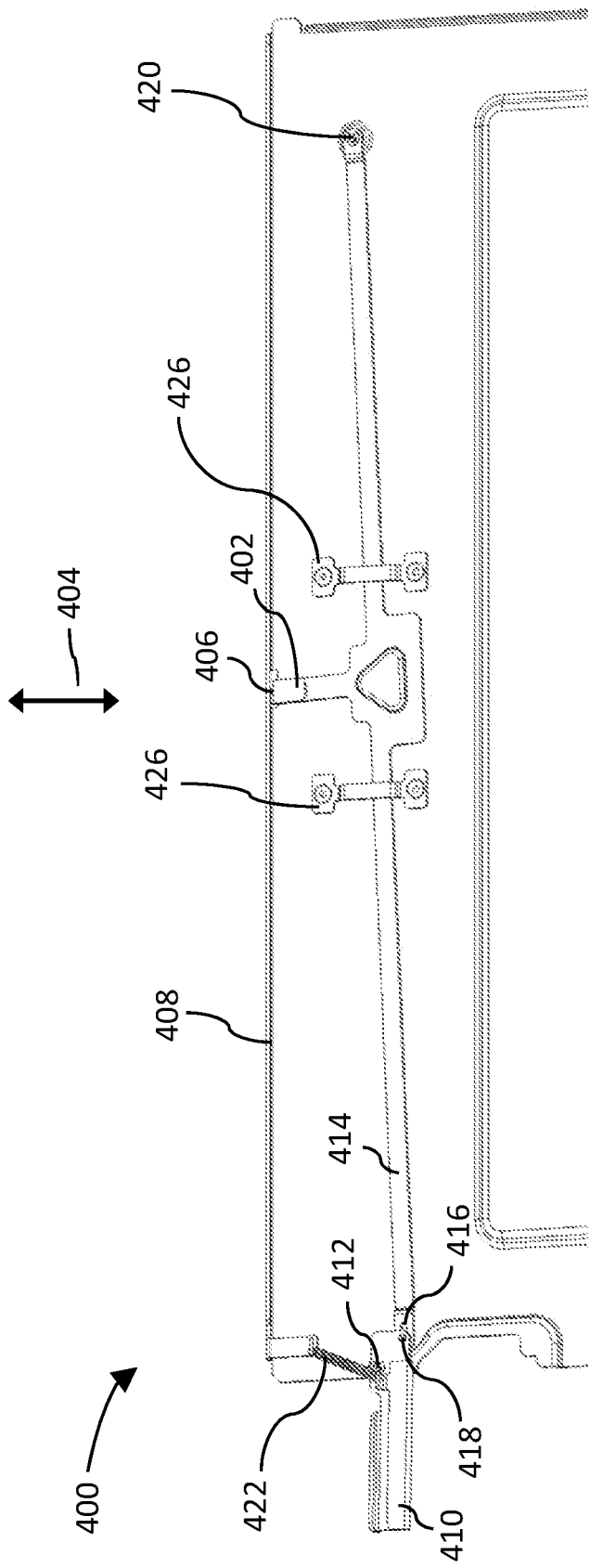
Figure 13B:
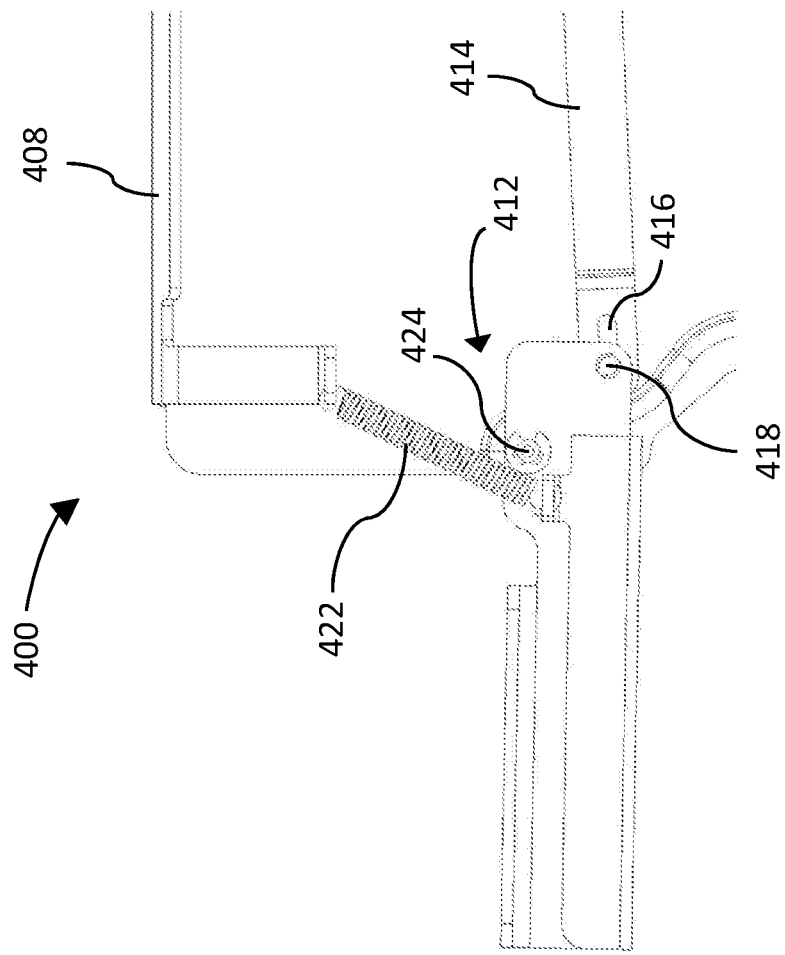
Figure 13A:
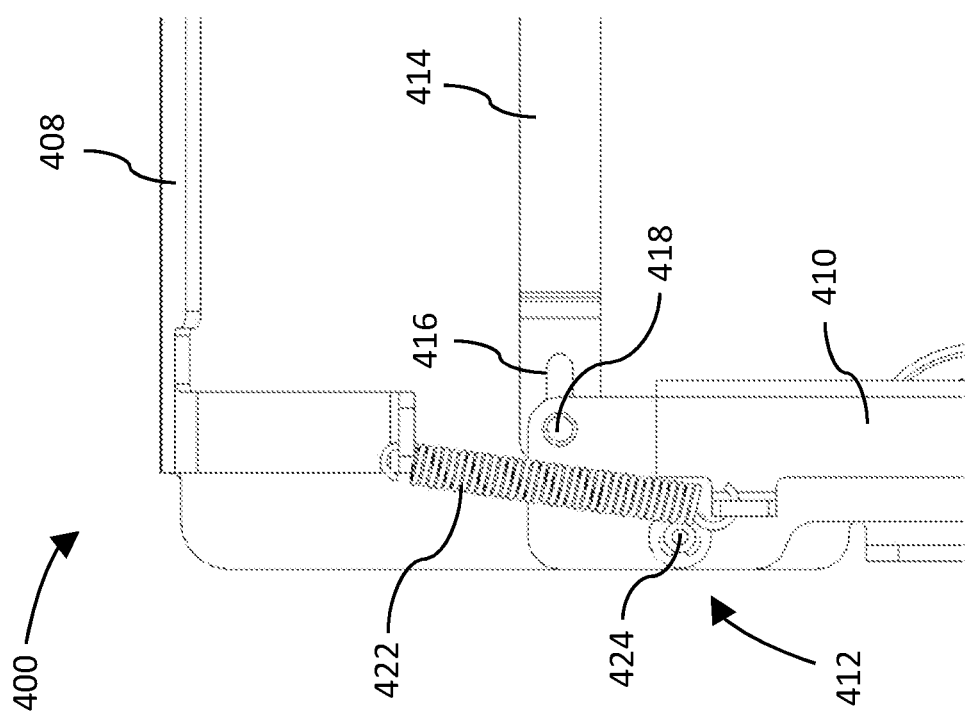

FIGS. 12A, 12B, 13A, and 13B show a latch assembly 400 that can be used with the enclosures and top cover assemblies described above. The latch assembly 400 includes a latch portion 402, which can move along a substantially linear axis 404 between a latched position (where the latch portion 402 is secured to an enclosure) and an unlatched position (where the latch portion 402 is uncoupled from the enclosure). As the latch portion 402 moves from the unlatched position (as shown in FIG. 12B) to the latched position (shown in FIG. 12A), the latch portion 402 extends further through an opening 406 in a lid 408.

The latch portion 402 is moved from the unlatched position to the latched position by pulling a handle 410. The handle 410 is rotatably coupled to the lid 408 at a pin 412 or a similar feature that allows the handle 410 to rotate about the feature. The handle 410 is also coupled to a bar 414 (or a similar feature), which includes a slot 416. For example, the handle 410 may include another pin 418 or pin-like feature that can slide within the slot 416. As the handle 410 is pulled by a user, the handle 410 rotates clockwise about the pin 412 and the other pin 418 slides within the slot 416. Further, as the handle 410 is pulled by a user, the bar 414 is rotated about another pin 420 or pin-like feature, which rotatably couples the bar 414 to the lid 408. As the bar 414 rotates, the bar 414 moves the latch portion 402 from the latched position to the unlatched position so that the lid 408 can be opened.

The handle 410 is also coupled to the lid 408 by a spring 422. As the handle 410 opens and closes (e.g., rotates between an open position shown in FIG. 13B and a closed position shown in FIG. 13A), the spring 422 will pass over a center 424 (shown in FIGS. 13A and 13B) of a pivot point of the handle 410 which causes a snap-like feeling for the user as the handle 410 is opened and closed. The spring 422 is in tension and will hold the handle 410 closed or open. If a user forgets to close the handle 410, the handle 410 can automatically engage itself closed as the enclosure is being put into a rack. As shown in FIGS. 12A and 12B, guide brackets 426 can be coupled to the lid 408 (e.g., via rivets or similar means) to support the bar 414, which can rest on the guide brackets 426.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising: a chassis and a top cover assembly coupled to the chassis, the top cover assembly including a first lid, a second lid, a middle cover therebetween, and a hinge coupling together the first lid, the second lid, and the middle cover, the first lid is rotatable with respect to the second lid while the second lid is fixedly attached to the chassis, and the second lid is rotatable with respect to the first lid while the first lid is fixedly attached to the chassis, wherein the chassis includes a first side wall with a first cam slot and a second cam slot, wherein the first lid includes a first pin extending within the first cam slot when the first lid is closed, wherein the second lid includes a second pin extending within the second cam slot when the second lid is closed.

2. The system of claim 1, wherein the hinge includes a flexible, non-metallic material, wherein the chassis houses a plurality of data storage devices.

3. The system of claim 1, wherein the first pin is configured to slide within the first cam slot as the first lid is opened, wherein the second in is configured to slide within the second cam slot as the second lid is opened.

4. The system of claim 1, wherein the first lid, the second lid, and the middle cover each include fingers that are bent to couple the hinge to the first lid, the second lid, and the middle cover.

5. The system of claim 1, wherein the first lid is rotatable about a first hinge axis, wherein the second lid is rotatable about a second hinge axis different than the first hinge axis.

6. The system of claim 5, wherein the middle cover is rotatable about both the first hinge axis and the second hinge axis.

7. The system of claim 1, further comprising:
a single sensor assembly arranged to sense when the first lid is open but the second lid is closed and to sense when the second lid is open but the first lid is closed.

8. The system of claim 1, further comprising:
a latch assembly including a latch linearly movable within a plane between a latched position and an unlatched position in response to rotating a handle within the place, wherein the handle is indirectly coupled to the latch.

9. The system of claim 8, wherein the handle is coupled to a spring.

10. An assembly comprising:
a first lid;
a second lid;
a middle cover therebetween the first lid and the second lid;
a hinge coupling together the first lid, the second lid, and the middle cover; and
a single sensor assembly arranged to sense when the first lid is open but the second lid is closed and arranged to sense when the second lid is open but the first lid is closed, the single sensor assembly further arranged to contact the middle cover when the middle cover is closed.

11. The assembly of claim 10, wherein the hinge includes a flexible, non-metallic material comprising polypropylene.

12. The assembly of claim 10, wherein the first lid, the second lid, and the middle cover each include fingers that are bent to couple the hinge to the first lid, the second lid, and the middle cover.

13. The assembly of claim 10, wherein the middle cover is shorter than the first lid and the second lid.

14. The assembly of claim 10, wherein the single sensor assembly is arranged adjacent the middle cover to detect when the middle cover is opened.

15. A method comprising:
partially removing an enclosure from a rack such that a second lid coupled to a hinge of a top cover assembly remains at least partially positioned within the rack;
unlatching a front end of a first lid coupled to the hinge of the top cover assembly from the enclosure while the second lid remains at least partially positioned within the rack; and
rotating the first lid and a middle cover coupled to the hinge of the top cover assembly with respect to the second lid to expose an interior of the enclosure while the second lid is secured to the enclosure and while the second lid remains at least partially positioned within the rack; wherein the first lid, the second lid, and the middle cover each include fingers that are bent to couple the hinge to the first lid, the second lid, and the middle cover.

16. The method of claim 15, further comprising:
removing the enclosure from the rack such that the second lid is removed from the rack;
unlatching a back end of the second lid from the enclosure; and
rotating the second lid and the middle cover with respect to the first lid to expose the interior of the enclosure.

17. The method of claim 16, wherein the top cover assembly includes a latch assembly, wherein unlatching the back end of the second lid from the enclosure includes: rotating a handle of the latch assembly to linearly move a latch of the latch assembly from a latched position to an unlatched position.

* * * * *